United States Patent
Aresta et al.

(10) Patent No.: US 12,424,606 B2
(45) Date of Patent: Sep. 23, 2025

(54) METHOD OF FABRICATING A COMPONENT MATERIAL FOR A BATTERY CELL

(71) Applicant: ILIKA TECHNOLOGIES LTD, Romsey (GB)

(72) Inventors: Gianfranco Aresta, Southampton (GB); Louise Turner, Salisbury (GB); Thomas Foley, Southampton (GB); Thomas Risbridger, Southampton (GB); Brian Elliott Hayden, Lyndhurst (GB); William Richardson, Oxford (GB); Robert Noble, Lockerley (GB); Owain Clark, Southampton (GB)

(73) Assignee: Ilika Technologies Ltd, Romsey (GB)

( * ) Notice: Subject to any disclaimer, the term of this patent is extended or adjusted under 35 U.S.C. 154(b) by 516 days.

(21) Appl. No.: 17/762,587

(22) PCT Filed: Sep. 29, 2020

(86) PCT No.: PCT/GB2020/052347
§ 371 (c)(1),
(2) Date: Mar. 22, 2022

(87) PCT Pub. No.: WO2021/064356
PCT Pub. Date: Apr. 8, 2021

(65) Prior Publication Data
US 2022/0344628 A1   Oct. 27, 2022

(30) Foreign Application Priority Data

Sep. 30, 2019 (GB) .................................... 1914061

(51) Int. Cl.
*H01M 4/04* (2006.01)
*H01M 4/02* (2006.01)
(Continued)

(52) U.S. Cl.
CPC ....... *H01M 4/0404* (2013.01); *H01M 4/0426* (2013.01); *H01M 4/485* (2013.01);
(Continued)

(58) Field of Classification Search
CPC .. H01M 4/0404; H01M 4/0426; H01M 4/485; H01M 4/505; H01M 4/525;
(Continued)

(56) References Cited

U.S. PATENT DOCUMENTS

| 5,556,519 A | 9/1996 | Teer |
| 6,030,509 A | 2/2000 | Fu-Kang et al. |

(Continued)

FOREIGN PATENT DOCUMENTS

| CN | 1757086 A | 4/2006 |
| CN | 102035030 A | 4/2011 |

(Continued)

OTHER PUBLICATIONS

International Search Report and Written Opinion mailed Feb. 10, 2021 in corresponding International Application No. PCT/GB2020/052347.

(Continued)

*Primary Examiner* — Daniel S Gatewood
(74) *Attorney, Agent, or Firm* — Renner, Otto, Boisselle & Sklar, LLP (57) ABSTRACT

A method is provided for fabricating a component material for a battery cell. The method comprises the steps of: providing a partially-fabricated battery cell, the partially-fabricated battery cell comprising a substrate having a planar deposition surface consisting of a first face of the substrate and a first battery component layer provided on the planar deposition surface, the substrate having a plurality of further surfaces, the planar deposition surface and the plurality of further surfaces defining the body of the substrate therebe- (Continued)

tween; wherein: the first battery component layer contains charge-carrying metal species and has an exposed surface; one or more electrically conductive or semi-conductive pathways extend through at least a portion of the substrate, each of the one or more pathways connecting the planar deposition surface to one of the plurality of further surfaces; and the partially-fabricated battery cell is held in position within a deposition chamber by a holding structure and each site of connection between one of the one or more pathways and the holding structure is electrically insulating; the method further comprising the step of depositing a second battery component layer on the first battery component layer, wherein the depositing comprises forming a plasma within the deposition chamber.

25 Claims, 8 Drawing Sheets

(51) Int. Cl.
| | | |
|---|---|---|
| *H01M 4/485* | (2010.01) | |
| *H01M 4/505* | (2010.01) | |
| *H01M 4/525* | (2010.01) | |
| *H01M 4/66* | (2006.01) | |
| *H01M 10/0525* | (2010.01) | |
| *H01M 10/0562* | (2010.01) | |

(52) U.S. Cl.
CPC ............ *H01M 4/505* (2013.01); *H01M 4/525* (2013.01); *H01M 4/66* (2013.01); *H01M 10/0525* (2013.01); *H01M 10/0562* (2013.01); *H01M 2004/021* (2013.01); *H01M 2004/028* (2013.01); *H01M 2300/0071* (2013.01)

(58) Field of Classification Search
CPC ............... H01M 4/66; H01M 10/0525; H01M 10/0562; H01M 2004/021; H01M 2004/028; H01M 2300/0071; H01M 6/40; H01M 6/188; H01M 10/0436; H01M 10/052; H01M 10/0585; Y02E 60/10; C23C 14/0036; C23C 14/0676; C23C 28/00; C23C 14/50
See application file for complete search history.

(56) References Cited

U.S. PATENT DOCUMENTS

| | | | |
|---|---|---|---|
| 6,863,699 B1 | 3/2005 | Krasnov et al. | |
| 6,982,132 B1 | 1/2006 | Goldner et al. | |
| 2003/0118897 A1 | 6/2003 | Mino et al. | |
| 2005/0016458 A1 | 1/2005 | Zhang et al. | |
| 2008/0032236 A1 | 2/2008 | Wallace et al. | |
| 2008/0213664 A1* | 9/2008 | Krasnov ............... | H01M 4/139 429/220 |
| 2014/0087092 A1* | 3/2014 | Nieh ..................... | H01M 4/139 118/723 VE |
| 2016/0343552 A1* | 11/2016 | Sun ................... | H01M 10/0585 |
| 2017/0288272 A1 | 10/2017 | Kwak et al. | |

FOREIGN PATENT DOCUMENTS

| | | |
|---|---|---|
| CN | 105900212 A | 8/2016 |
| CN | 106797056 A | 5/2017 |
| EP | 2309581 A1 | 4/2011 |
| JP | H03191061 | 8/1991 |
| JP | 2013060618 A | 4/2013 |
| WO | 2002065573 A1 | 8/2002 |
| WO | 2004061887 A1 | 7/2004 |
| WO | 2015/102836 | 7/2015 |
| WO | 2015/112986 | 7/2015 |
| WO | 2016/033450 | 3/2016 |
| WO | 2019/053408 | 3/2019 |
| WO | 2021064356 A1 | 4/2021 |

OTHER PUBLICATIONS

Search Report mailed Feb. 24, 2020 in corresponding GB Application No. GB1914061.5.
Kelly, et al., "Magnetron sputtering: a review of recent developments and applications," Vacuum 56 (2000) 159-172.
Scheiner, Brett Stanford. "Theory and simulation of electron sheaths and anode spots in low pressure laboratory plasmas." PhD (Doctor of Philosophy) thesis, University of Iowa, 2017.
Matt Hughes, "What is RF Sputtering?" Semicore Equipment, Inc., pp. 1-4, Oct. 27, 2016.
"Metal wafer substrates for semiconductor manufacturing," Plansee, Mar. 2019, https://www.plansee.com/en/products/components/electronic-thermal-management-materials/metal-wafer-substrates-for-semiconductor-manufacturing.html.
Japanese Office Action for corresponding Application No. 2022-518866, issued Jul. 16, 2024, with English translation.

* cited by examiner

METHOD OF FABRICATING A COMPONENT MATERIAL FOR A BATTERY CELL

This application is a national phase of International Application No. PCT/GB2020/052347 filed Sep. 29, 2020, which claims priority to United Kingdom Application No. 1914061.5 filed Sep. 30, 2019, each of which is hereby incorporated herein by reference in its entirety.

FIELD OF THE INVENTION

The present invention relates to methods for fabricating component materials for battery cells, in particular to methods including the step of forming a plasma.

BACKGROUND TO THE INVENTION

Solid state microbatteries typically comprise an active stack of thin layers. The active stack is formed by two electrodes (an anode and a cathode) that are separated by a solid state electrolyte. Typically, an anode current collector is provided on the face of the anode that is opposed to the electrolyte, and a cathode current collector is provided on the face of the cathode that is opposed to the electrolyte.

The release of electrical energy from the microbatteries occurs through migration of charge-carrying metal species from the anode to the cathode, via the electrolyte, which causes electrons to flow in the external circuit. The charge-carrying metal species are typically metal ions, such as lithium ions. In certain cases, the microbatteries are rechargeable, that is, they may be used to reversibly store and release energy. In such cases, the storage of energy (in chemical form) occurs during re-charging of the battery through migration of charge-carrying metal species from the cathode to the anode, via the electrolyte.

As used herein, the term "anode" refers to the electrode having the more negative electrode potential and the term "cathode" refers to the electrode having the more positive electrode potential. Alternatively, the anode may be referred to as the negative electrode and the cathode as the positive electrode.

Typically, solid state microbatteries are formed by depositing the individual thin layers on a support layer, which is self-supporting and provides mechanical support to the deposited thin layers.

The material of the support layer may be selected from a wide range, including silicon, aluminium oxide (sapphire), glass, stainless steel, silicon nitride and silicon oxide. For example, the material of the support layer may be p-type or n-type silicon (for example, boron-doped silicon or phosphorus-doped silicon) grown by methods such as the Czochralski method (known as CZ silicon). As may be seen from this list, the material of the support layer may be electrically conducting, semi-conducting, or non-conductive.

Certain fabrication processes for microbatteries may be limited to specific component materials and/or battery configurations. It is therefore desirable to reduce these constraints, so as to increase the general applicability of individual fabrication processes.

SUMMARY OF THE INVENTION

It has been found that when a battery cell is fabricated by depositing component layers on a substrate having electrically conductive or semi-conductive pathways extending therethrough, the deposition of an individual layer using a plasma deposition process may cause a reduction in the concentration of charge-carrying metal species in one or more underlying battery component layers, such that the capacity of the resulting battery cell is significantly reduced and/or the resistance of the battery cell is increased.

Surprisingly, it has been found that this problem may be alleviated by avoiding the creation of electrically conductive or semi-conductive pathways extending from the deposition surface of the substrate into the holding structure that holds the substrate in place. In certain cases, this approach may allow continued use of electrically conductive or semi-conductive support layers, which may advantageously allow electrical connection to be provided to the battery via the support layer. Additionally, or alternatively, this procedure may allow continued use of unpatterned current collector layers that extend across an entire face of the substrate.

Therefore, in a first aspect, the present invention may provide a method of fabricating a component material for a battery cell comprising the steps of:

providing a partially-fabricated battery cell, the partially-fabricated battery cell comprising a substrate having a planar deposition surface consisting of a first face of the substrate and a first battery component layer provided on the planar deposition surface, the substrate having a plurality of further surfaces, the planar deposition surface and the plurality of further surfaces defining the body of the substrate therebetween;

wherein:

the first battery component layer contains charge-carrying metal species and has an exposed surface;

one or more electrically conductive or semi-conductive pathways extend through at least a portion of the substrate, each of the one or more pathways connecting the planar deposition surface to one of the plurality of further surfaces; and the partially-fabricated battery cell is held in position within a deposition chamber by a holding structure and each site of connection between one of the one or more pathways and the holding structure is electrically insulating;

the method further comprising the step of depositing a second battery component layer on the first battery component layer, wherein the depositing comprises forming a plasma within the deposition chamber.

Effectively, the partially-fabricated battery cell is electrically floating with respect to the holding structure. In certain cases, the partially-fabricated battery cell is separated from the holding structure by one or more dielectric spacers.

In certain cases, the holding structure may be electrically floating. In other cases, the holding structure may be electrically grounded, for example, via an internal surface of the deposition chamber.

Typically, the substrate comprises a support layer. The support layer typically has a thickness of at least 100 μm, in certain cases at least 150 μm, in other cases at least 200 μm. In general, the thickness of the support layer is less than 1200 μm, in certain cases, less than 1000 μm. The composition of the support layer and its thickness are chosen so that it is self-supporting, that is, it is able to provide mechanical support to at least the first battery component layer.

The substrate may additionally comprise further layers that are supported by the support layer. For example, a current collector layer may be provided on one or more faces of the support layer. The current collector may comprise a material selected from the group consisting of Pt, Ni, Mo, Al, Au, W, Ti, stainless steel, nickel alloys and indium doped tin oxide (ITO) and other electrically conducting metal oxides. The current collector layer typically has a thickness in the range 0.05 to 1 μm. The current collector layer is generally provided between the support layer and the first battery component layer.

In certain cases, the current collector layer may be coterminous with a face of the support layer. In other cases, the perimeter of the current collector layer may lie inside the perimeter of a face of the support layer.

In certain cases, an adhesion layer may be provided between the support layer and the current collector layer. The adhesion layer typically has a thickness in the range 5-50 nm. The adhesion layer may comprise a material selected from the group consisting of titanium, titanium oxide, chromium, aluminium, and titanium-tungsten alloys.

In certain cases, the substrate may comprise a silicon support layer having platinum layers on both faces and titanium oxide adhesion layers provided between each platinum layer and the support layer. This configuration may be denoted as Pt—Ti—Si—Ti—Pt.

In certain cases, the substrate comprises a second face opposed to the first face, and one of the one or more electrically conductive or semi-conductive pathways extends between the first face and the second face, that is, between the planar deposition surface and the second face. In such cases, the substrate typically comprises a support layer that is electrically conductive or semi-conductive. For example, the support layer may have an electrical resistivity of 1000 Ω·cm or less in a direction away from the planar deposition surface. In certain cases, the support layer may have an electrical resistivity of 100 Ω·cm or less in a direction away from the planar deposition surface. In certain cases, the support layer may have an electrical resistivity of 10 Ω·cm or less in a direction away from the planar deposition surface. In certain cases, the support layer may have an electrical resistivity of 1 Ω·cm or less in a direction away from the planar deposition surface. In certain cases, the support layer may have an electrical resistivity of 0.1 Ω·cm or less in a direction away from the planar deposition surface. In certain cases, the support layer may have an electrical resistivity of 0.01 Ω·cm or less in a direction away from the planar deposition surface. The term "electrical resistivity" refers to the electrical resistivity measured at 25° C.

Typically, in such cases, the support layer comprises a metal, a metal alloy, or a semiconductor material. For example, the support layer may comprise a material selected from the group consisting of: silicon, aluminium, copper, iron-nickel-cobalt alloys (such as Kovar™), molybdenum, molybdenum-copper alloys and steel (for example, stainless steel). In certain cases, the support layer may comprise p-type or n-type silicon (for example, boron-doped silicon or phosphorus-doped silicon), that may have been grown by Czochralski method (known as CZ silicon).

In certain cases, at least a portion of one of the one or more electrically conductive or semi-conductive pathways is aligned with the planar deposition surface. This situation may arise when the planar deposition surface is provided by a current collector layer that is coterminous with a face of the support layer (the support layer in such cases may be electrically conductive, semi-conductive, or insulating, and may comprise a material selected from the group consisting of: silicon, aluminium oxide (sapphire), glass, steel (for example, stainless steel), silicon nitride, silicon oxide, aluminium, copper, molybdenum, molybdenum-copper alloys, and iron-nickel-cobalt alloys (such as Kovar™)). In such cases, one or more electrically conductive or semi-conductive pathways may extend through the current collector layer to the perimeter of the planar deposition surface, and it may be necessary to prevent such pathways extending into the holding structure, in order to avoid adverse effects during deposition of the second battery component layer.

Alternatively, this situation may arise when the support layer is electrically conductive or semi-conductive, and provides an electrically conductive or semi-conductive pathway within the plane of the layer (as well as through the thickness of the layer). Typically, in such cases, the support layer comprises a metal, a metal alloy, or a semiconductor material. For example, the support layer may comprise a material selected from the group consisting of: silicon, aluminium, copper, iron-nickel-cobalt alloys (such as Kovar™), molybdenum, molybdenum-copper alloys, and steel (for example, stainless steel). In certain cases, the support layer may comprise p-type or n-type silicon (for example, boron-doped silicon or phosphorus-doped silicon), that may have been grown by Czochralski method (known as CZ silicon).

The charge-carrying metal species of the first battery component layer may comprise $Li^+$ ions, $Na^+$ ions, and/or $Mg^{2+}$ ions. Typically, the charge-carrying metal species of the first battery component layer comprise $Li^+$ ions.

The first battery component layer may comprise an electrode active material or an electrolyte. For example, the first battery component layer may comprise a positive electrode active material.

For example, the first battery component layer may comprise a positive electrode active material selected from the group consisting of: $LiCoPO_4$, $LiNi_{0.5}Mn_{1.5}O_4$, $LiMn_{1-y}Co_yO_2$ (wherein $0<y<1$), $LiMnPO_4$, $LiMn_2O_4$, $LiCoO_2$, $LiNiO_2$, $LiNi_{1-y}Co_yO_2$ (wherein $0<y<1$), $LiNi_{1-y-z}Mn_yCo_zO_2$ (wherein $y>0$, $z>0$, and $y+z<1$, e.g. $LiNi_{1/3}Mn_{1/3}Co_{1/3}O_2$), $LiFePO_4$, $LiNiPO_4$, $Li_2NiPO_4F$, $Li_2CoPO_4F$, $LiMnPO_4$, $LiMnPO_4F$, $Li_2CoSiO_4$, $Li_2MnSiO_4$, $FeF_3$, $LiMn_{0.8}Fe_{0.1}Ni_{0.1}PO_4$, $Li_{1-x}VOPO_4$ (wherein $0 \leq x<1$), $Li_3V_2(PO_4)_3$, $Li_2FePO_4F$, $Na_3MnPO_4CO_3$, $Na_xMO_2$ (wherein M is Co, Fe, Mn, Ni or combinations thereof and typically $0<x \leq 1$), $NaMPO_4$ (where M is Fe, Mn, Co, Ni or combinations thereof), and $Na_2FePO_4F$.

In certain cases, the positive electrode active material is lithium cobalt oxide.

Typically, the first battery component layer comprises an electrode active material and the second battery component layer comprises an electrolyte. In general, the second battery component layer also contains charge-carrying metal species, such as $Li^+$ ions, $Na^+$ ions, and/or $Mg^{2+}$ ions. In general, the charge-carrying metal species of the second battery component layer and the charge-carrying metal species of the first battery component layer are the same. Typically, the charge-carrying metal species of the second battery component layer comprise $Li^+$ ions.

The electrolyte may be provided by a material selected from the group consisting of: LiPON (for example $Li_xP_yO_zN_w$ (wherein $0<x \leq 4.5$; $0<y \leq 1$; $0<z \leq 5.5$; and $0<w \leq 1$) or $xLi_2O:P_2O_5:zPON$); LiPBON (for example, $Li_xP_yB_zO_dN_e$, wherein $x=0.2-0.5$; $y=0.05-0.15$; $z=0.001-0.2$; $d=0.35-0.5$; and $e=0.02-0.18$); $Li_3PO_4$; cation-doped $Li_7La_3Zr_2O_{12}$ (wherein the cation dopants may include tantalum, barium, niobium, yttrium, zinc, and combinations thereof); $Li_{1.5}Al_{0.5}Ge_{1.5}(PO_4)_3$; and $Li_{1.3}Al_{0.3}Ti_{1.7}(PO_4)_3$.

In the case that the first battery component layer comprises an electrode active material and the second battery component layer comprises an electrolyte, the method according to the first aspect of the invention may additionally include the step of providing a further electrode active material on the electrolyte to form an active stack comprising two electrodes that are separated by the electrolyte.

In the case that the first battery component layer comprises an electrolyte, the second battery component layer may comprise an electrode active material.

Typically, the battery cell is a thin film battery. Thus, the first battery component layer may have a thickness in the range 1-40 µm (for example, 1-30 µm) and/or the second battery component layer may be deposited to a thickness in the range 0.3-20 µm (for example, 0.3-15 µm).

Typically, the step of depositing the second battery component layer on the first battery component layer comprises forming an AC plasma (for example, a RF plasma generated from a source having a frequency typically in the range 1-300 MHz, such as 13.56 MHz, or a microwave frequency plasma generated from a source having a frequency typically above 300 MHz and below about 30 GHz, such as 2.45 GHz). However, in certain cases, the step of depositing the second battery component layer on the first battery component layer comprises forming a DC plasma.

In certain cases, the step of depositing the second battery component layer on the first battery component layer comprises a sputtering process in which a target is typically bombarded by inert high energy ions (for example, $Ar^+$), resulting in emission of material from the target as a fine spray (comprising atoms, ions, and/or clusters of atoms from the target), at least a portion of which is then deposited on the exposed surface of the first battery component layer. In certain cases, the sputtering process may comprise reactive sputtering using a reactive gas, in which the reactive gas chemically reacts with material ejected from the target before being deposited on the exposed surface of the first battery layer. For example, the sputtering process may comprise the use of lithium phosphate ($Li_3PO_4$) as the target and nitrogen as the reactive gas, the material ejected from the lithium phosphate target reacting with the activated nitrogen to deposit LiPON on the exposed surface of the first battery component layer.

In other cases, the step of depositing the second battery component layer on the exposed surface of the first battery component layer may comprise plasma-enhanced chemical vapour deposition or plasma-enhanced atomic layer deposition.

Typically, the substrate is planar, that is, it has two opposed faces and the separation of the faces is less than the dimensions of each individual face. For example, the substrate may be substantially shaped as a disc, that is, it may have a circular or substantially circular perimeter (for example, the substrate may substantially circular, but also have a straight edge portion corresponding to a chord of the circle).

Typically, the holding structure comprises a metal or metal alloy. This is generally preferred, since the holding structure is typically required to have a complex shape, and in general, this can be more readily created from a metal or metal alloy. In certain cases, the holding structure may be provided by an electrically-insulating material, such as a ceramic. However, this is less preferred, as it is often more difficult to process such materials into complex shapes.

In general, the holding structure comprises a clamp ring that extends around at least a portion of the perimeter of the substrate. The clamp ring may comprise a metal or a metallic alloy. For example, the clamp ring may comprise molybdenum and/or tantalum. Alternatively, the clamp ring may comprise a nickel alloy such as Inconel™.

In certain cases, a mask is provided in the deposition chamber. The mask may be, for example, a shadow mask or an open mask. The mask is typically arranged such that the planar deposition surface faces towards the mask.

A shadow mask typically has multiple apertures. An open mask typically has an aperture that defines an area that is at least 70% (in certain cases at least 80%, in certain cases at least 85%, and in certain cases at least 90%) of the planar surface of the substrate. An open mask typically has an annular configuration.

A shadow mask is typically provided when it is desired to deposit a battery component layer in a patterned form, that is, when it is desired to deposit a battery component layer as a set of multiple discrete coplanar elements. In such a case, each element may provide a component of an individual battery. For the avoidance of doubt, it is noted that battery component layers may also be patterned after deposition, for example, through a process of selective etching or laser ablation.

An open mask may be provided when it is desired to constrain the deposition of a layer to the deposition surface, and avoid the deposition of material onto other elements within the deposition chamber, such as the holding structure.

In the case that a mask is provided within the deposition chamber, it is preferred that the mask is electrically connected to the holding structure and electrically isolated from the partially-fabricated battery cell. Therefore, in certain cases, both the mask and the holding structure may be grounded.

The mask is typically provided by an electrically conductive material, for example a metal or metal alloy such as stainless steel or molybdenum. The mask typically has a thickness of 0.1 mm to 0.5 mm.

In general, the mask is separated from the partially-fabricated battery cell by one or more dielectric spacers. However, in certain cases, a gap may be provided between the mask and the partially-fabricated battery cell, the gap having a dimension of at least 0.1 mm.

DETAILED DESCRIPTION

The invention will now be described by way of example only with reference to the following Figures in which:

FIGS. 3a) and 3b) show Raman spectra obtained from a layer of lithium cobalt oxide respectively before and after deposition of a LiPON layer on an exposed surface of the lithium cobalt oxide layer, using a deposition process not according to the method of the invention;

FIGS. 5a) and 5b) show Raman spectra obtained from a layer of lithium cobalt oxide respectively before and after deposition of a LiPON layer on an exposed surface of the lithium cobalt oxide layer, the deposition process being performed following an example of the method according to the invention.

Figure 1:
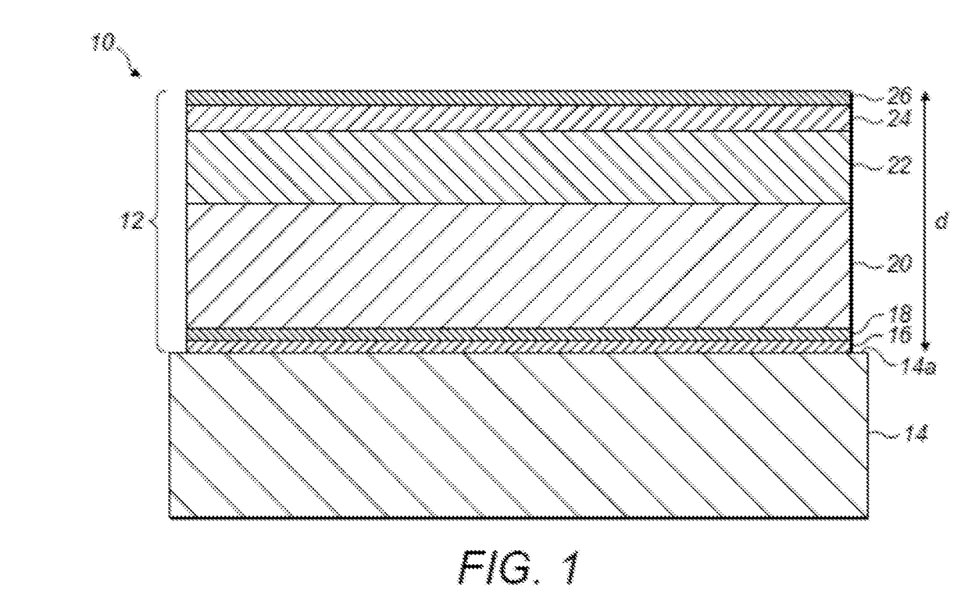
FIG. 1 shows a schematic cross-sectional view of an example thin film battery structure, the fabrication of which includes the method according to an example of the present invention.

FIG. 1 shows a schematic cross-sectional view (not to scale) of a thin film structure 10, through the depth d of a multi-layer thin film stack 12 supported on the planar surface 14a of a support layer 14.

The layers of the stack 12 comprise layers suitable for implementing various components of a battery. The support layer 14 is a wafer of electrically semi-conductive or conductive material (such as p-type boron-doped silicon grown by the Czochralski method (CZ silicon)).

A first layer on the surface 14a is an adhesion layer 16, comprising a layer of titanium dioxide. Overlaying this is a layer providing a cathode current collector 18, formed from platinum. A layer of lithium cobalt oxide forms a cathode 20 covering the platinum layer 18. An electrolyte separator layer 22 comprising lithium phosphorous oxynitride (LiPON) is deposited on top of the cathode 20. An anode layer 24 overlies the electrolyte layer 22. Finally, an anode current collector 26 is provided over the anode 24. This structure is purely exemplary, however, and the structure may comprise more, fewer or other layers formed from other materials.

Once fabricated or otherwise obtained, the structure 10 can be cut to isolate individual battery elements or cells one from another, e.g. using a laser cutting technique.

Figure 2:
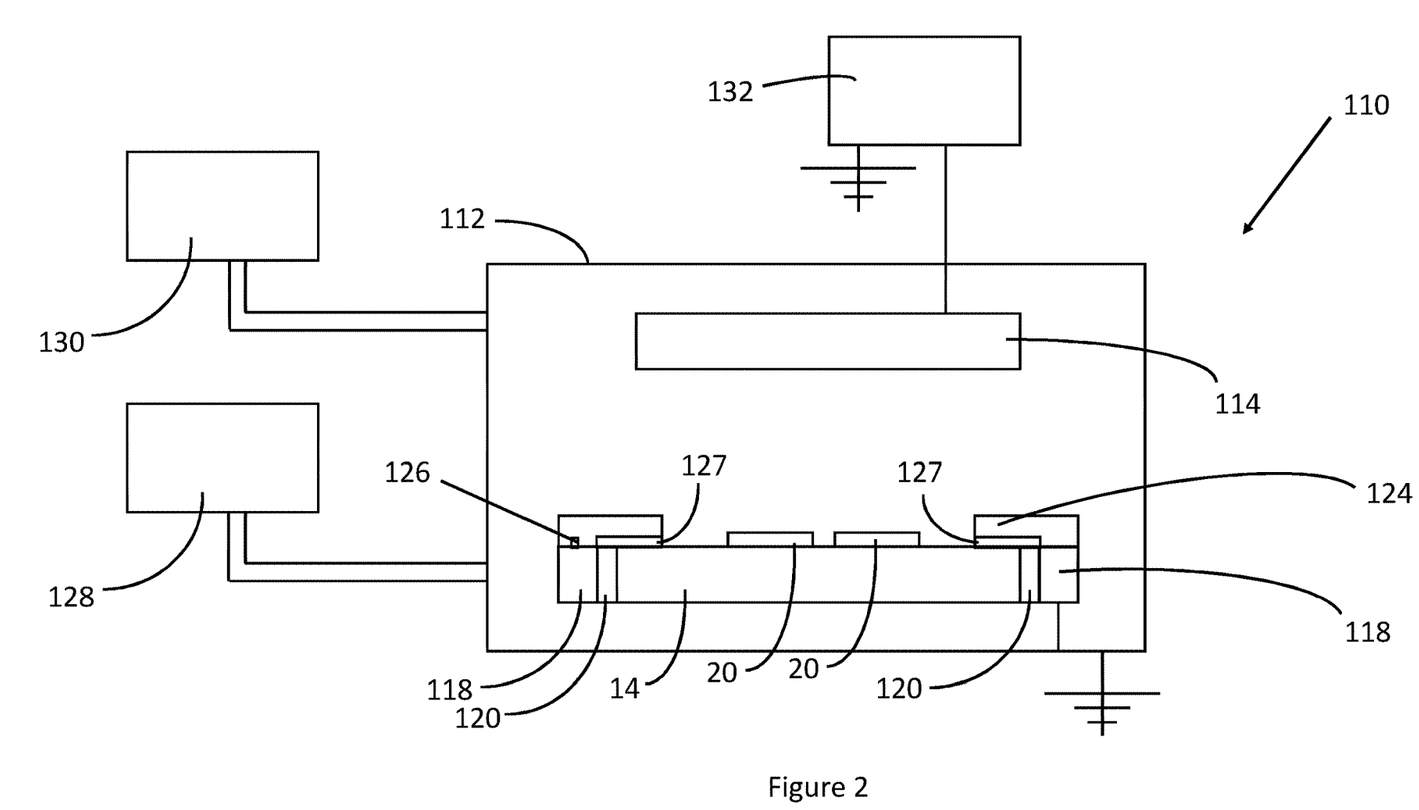
FIG. 2 shows a schematic cross-sectional view of an embodiment of a deposition system for use in an example of the method of the invention.

With reference to FIG. 2, a deposition system 110 for use in a method according to the invention comprises a deposition chamber 112 in which are located a target 114 and a disc-shaped support layer 14. The support layer is held in position by a clamp ring 118 extending about the perimeter of the support layer. The clamp ring 118 comprises an electrically conductive material. An annular spacer 120 is provided between the support layer 14 and the clamp ring 118, the spacer consisting of a dielectric material (such as a Kapton® film or pyrolytic boron nitride), such that the clamp ring 118 and the support layer 14 are electrically insulated from each other.

A first battery component layer 20 is provided on the side of the support layer 14 that faces towards the target. Additional layers may be provided between the support layer 14 and the first battery component layer 20, as shown in FIG. 1. The support layer 14 provides mechanical support for the first battery component layer 20 and any intermediate layers. The support layer 14, the first battery component layer 20 and any intermediate layers together provide a partially fabricated battery cell.

In this example, the first battery component layer 20 has been patterned, that is, it is provided in the form of multiple discrete coplanar elements. However, in alternative embodiments, the first battery component layer may be unpatterned and co-terminous with the substrate.

An open mask 124 is provided between the support layer 14 and the target 114. The open mask 124 has an annular configuration having a central aperture that defines an area that is at least 70% of that of one face of the support layer 14. For example, the central aperture may have a diameter of 130 mm or 140 mm, while the support layer 14 may have a diameter of 150 mm.

The open mask 124 is electrically connected to the clamp ring 118 via connector pin 126, that is, the open mask is shorted to the clamp ring. The open mask 124 is separated from the partially fabricated battery cell by an annular spacer 127 consisting of a dielectric material. In alternative configurations, the open mask 124 may be spaced apart from the partially fabricated battery cell provided by support layer 14, the first battery component layer, and any intermediate layers, by a distance of about 0.1 mm.

The open mask 124 is provided by an electrically conductive material, for example a metal or metal alloy such as stainless steel or molybdenum, and typically has a thickness of 0.1 mm to 0.5 mm.

The clamp ring 118 is electrically grounded via one of the internal surfaces of the deposition chamber 112. Thus, both the clamp ring 118 and the open mask 124 are electrically grounded, while the partially fabricated battery cell is electrically floating within the deposition chamber.

A vacuum pump system 128 and a process gas delivery system 130 are in communication with the deposition chamber 112. A radio frequency plasma power source 132 is connected to the target 114.

In use, the partially fabricated battery cell is initially held outside the deposition chamber 112, while the chamber is evacuated to a pressure of $1 \times 10^{-7}$ Torr by means of vacuum pump system 128. The partially fabricated battery cell, supported by clamp ring 118, and having open mask 124 located on the deposition surface (the mask being electrically isolated from the deposition surface), is then introduced into the deposition chamber 112, and positioned so that the mask 124 is between target 114 and the partially-fabricated battery cell, as shown in FIG. 2. The mask 124 is shorted to the clamp ring 118 by means of connector pin 126.

Controlled amounts of process and/or reactive gas are introduced into the deposition chamber by means of process gas delivery system 130. During the sputtering process the chamber pressure is typically $1 \times 10^{-3}$ Torr. The plasma power source 132 is then activated to energize the process and/or reactive gas and form a radio frequency plasma in the deposition chamber 112.

The presence of the high-energy ions in the plasma causes material to be ejected from the target 114 to form a fine spray that becomes at least partly deposited on the exposed surface of the first battery component layer 20, so as to form a second battery component layer (not shown). That is, the second battery component layer is deposited through a sputtering process.

In certain embodiments, the target 114 is a lithium phosphate target ($Li_3PO_4$), the reactive gas is nitrogen, and the second battery component layer is LiPON.

Raman Measurements

Figure 3:
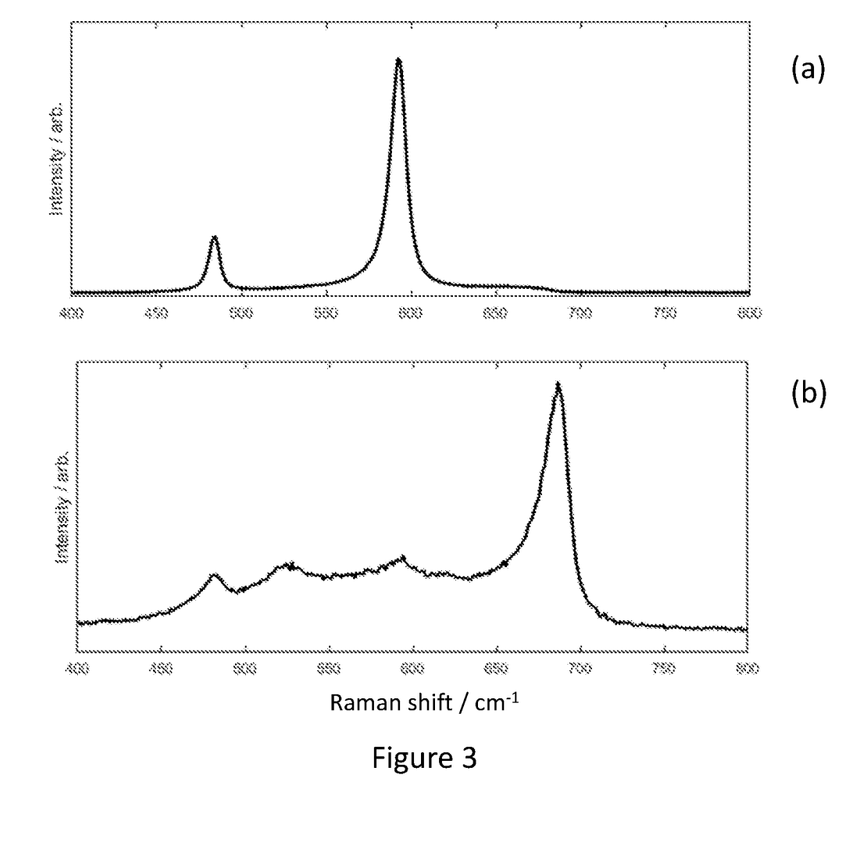

FIG. 3a) shows a Raman spectrum obtained from a layer of lithium cobalt oxide provided on a semi-conductive support layer of p-type boron-doped silicon. Well-defined peaks are observed for this oxide layer at about 485 $cm^{-1}$ and at approximately 595 $cm^{-1}$.

FIG. 3b) shows a Raman spectrum obtained from the same section of the oxide layer as FIG. 3a), after deposition of a thin 200 nm LiPON layer on the exposed surface of the oxide layer. The LiPON deposition was not carried out according to the method of the present invention. Specifically, the support layer was not electrically floating, but was instead in electrical contact with the clamp ring that was used to hold it in place in the deposition chamber.

FIG. 3b) displays a well-defined peak at just below about 700 $cm^{-1}$, while the prominence of the peaks originally observed in FIG. 3a) at about 485 $cm^{-1}$ and at approximately 595 $cm^{-1}$ is significantly reduced. This is thought to be due to the fact that, during the process of deposition of LiPON on the lithium cobalt oxide layer, $Li^+$ ions have migrated out of the lithium cobalt oxide layer, resulting in attenuation of the characteristic peaks for lithium cobalt oxide at about 485 $cm^{-1}$ and at about 595 $cm^{-1}$, and the development of a new peak at just below about 700 $cm^{-1}$ that is associated with the presence of a cobalt oxide-type ($Co_3O_4$) phase.

Figure 4:
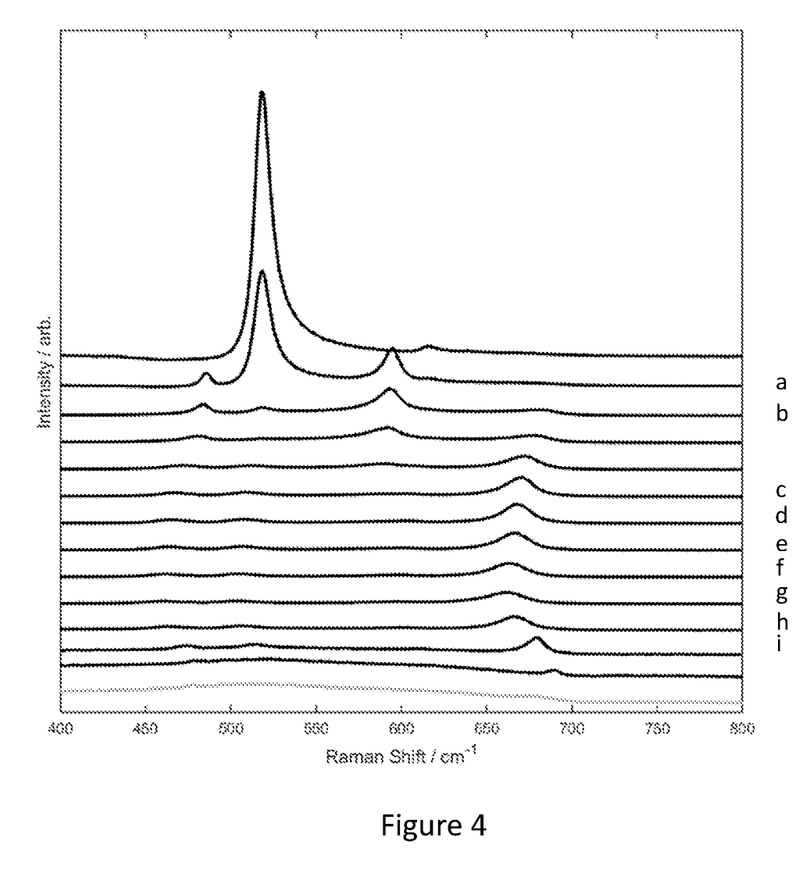
FIG. 4 shows multiple Raman spectra obtained from different depths of a layer of lithium cobalt oxide after deposition of a LiPON layer on an exposed surface of the lithium cobalt oxide layer, using a deposition process not according to the method of the invention.

FIG. 4 shows multiple Raman spectra obtained from an oxide layer, originally provided in the form of lithium cobalt oxide, after deposition of a LiPON layer on an exposed surface of the lithium cobalt oxide layer. The LiPON deposition was not carried out according to the method of the present invention. Specifically, the electrically conductive support layer on which the lithium cobalt oxide layer was provided was not electrically floating, but was instead in electrical contact with the clamp ring that was used to hold it in place in the deposition chamber.

The spectra are obtained from different depths of the oxide layer (originally provided in the form of lithium cobalt oxide), such that the spectrum closest to the x axis of FIG. 4 corresponds to the portion of the oxide layer closest to the oxide/LiPON interface, while the spectrum furthest from the x axis corresponds to the portion of oxide layer closest to (and adjacent to) the support layer. That is, the further a spectrum is shown from the x axis of FIG. 4, the closer the corresponding portion of oxide layer is to the support layer.

Spectra taken from close to the support layer (e.g. spectra (a) and (b)) exhibit defined peaks at about 485 $cm^{-1}$ and at about 595 $cm^{-1}$, indicating the presence of lithium cobalt oxide (the peak at about 525 $cm^{-1}$ in spectrum (a) is due to the support layer). There is no discernible presence of a cobalt oxide phase, which would be indicated by peaks at just below about 700 $cm^{-1}$.

By contrast, spectra taken from close to the interface between the oxide layer and the deposited LiPON layer (e.g. spectra (c) to (i)) do not exhibit any discernible peak at about 485 $cm^{-1}$ and at about 595 $cm^{-1}$, but defined peaks are generally observed at just below about 700 $cm^{-1}$. It is thought that the increased prominence of the peak at just below about 700 $cm^{-1}$ in the portions of the oxide layer close to the interface with the deposited LiPON layer is an indication of delithiation of the lithium cobalt oxide during LiPON deposition, resulting in the presence of cobalt oxide-type ($Co_3O_4$) phase.

Figure 5:
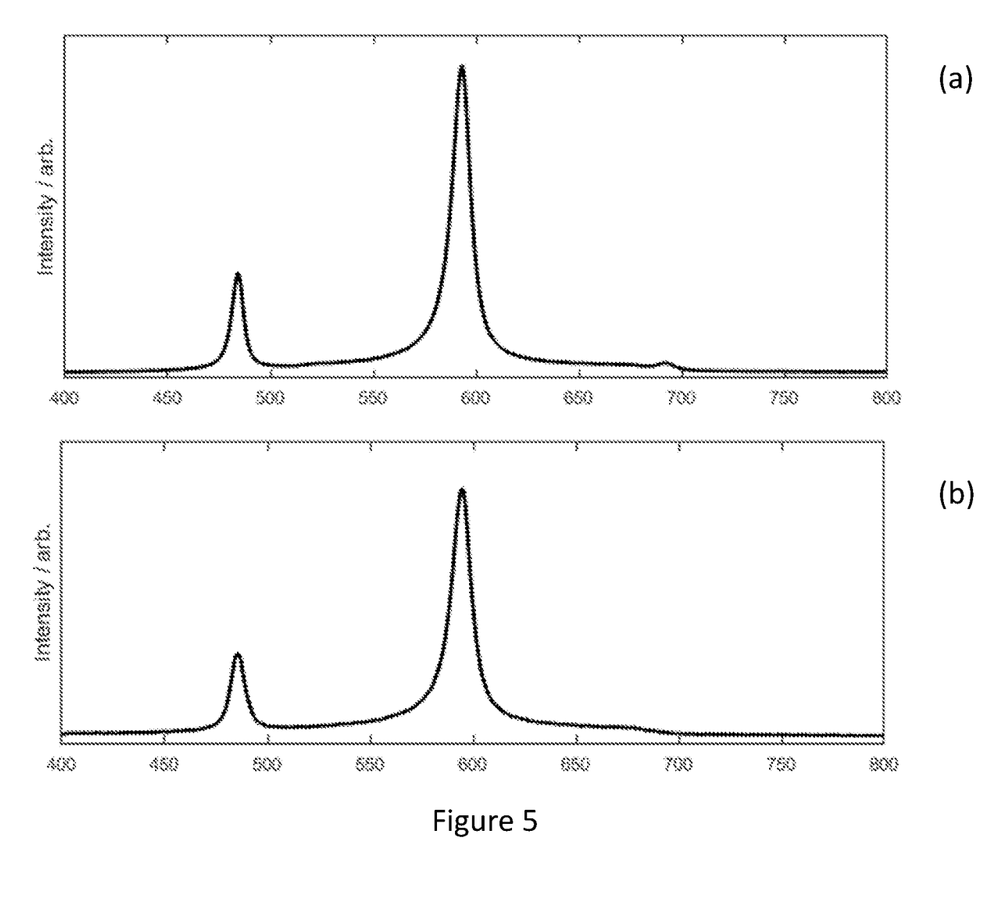

FIG. 5a) shows a Raman spectrum obtained from a layer of lithium cobalt oxide provided on an electrically conductive support layer. Well-defined peaks are observed at about 485 $cm^{-1}$ and at approximately 595 $cm^{-1}$.

FIG. 5b) shows a Raman spectrum obtained from the same section of the lithium cobalt oxide layer as FIG. 5a), after deposition of a LiPON layer on the exposed surface of the lithium cobalt oxide layer. The deposition of the LiPON layer was carried out according to an example of the method according to the present invention. The spectrum of FIG. 5b) is broadly similar to that of FIG. 5a), indicating that no significant compositional change has occurred in the lithium cobalt oxide layer during deposition of the LiPON layer.

Thickness Measurements

Figure 6A:
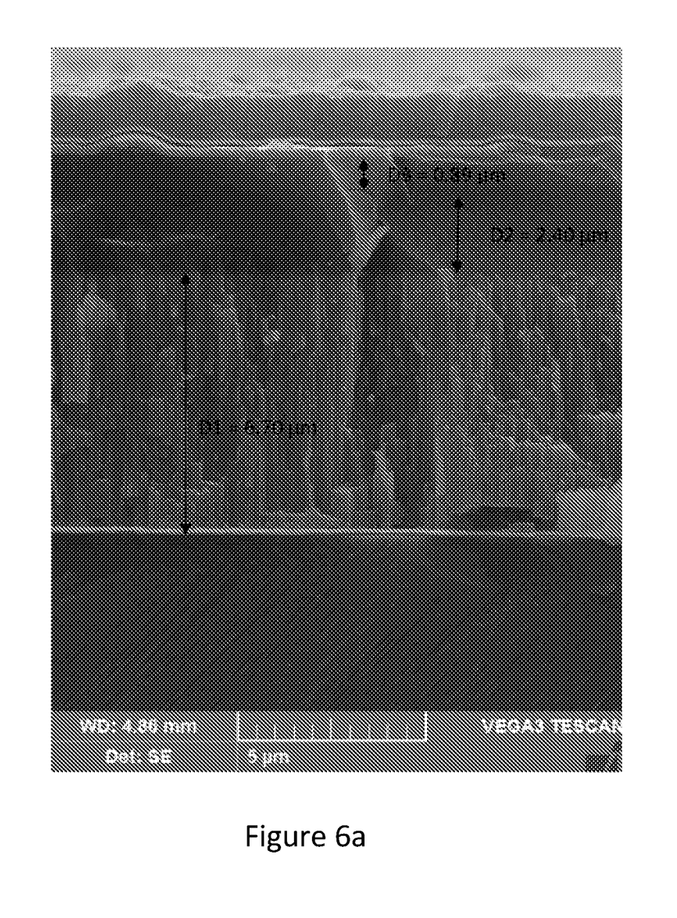
FIGS. 6a) and 6b) show scanning electron micrographs obtained from a cross-section of a stack of battery component layers deposited on a semiconductor support layer. The electrolyte of the stack shown in FIG. 6a) was deposited according to an example of the method of the invention. The electrolyte of the stack shown in FIG. 6b) was not deposited according to the method of the invention.

FIG. 6a) shows a scanning electron micrograph of a cross-section of a stack of battery component layers including a lithium cobalt oxide cathode, a LiPON electrolyte and an anode material, that have been deposited onto a semi-conductive support layer (a silicon wafer). The LiPON electrolyte layer was deposited according to an example of the method of the invention (that is, the partially-fabricated battery was insulated from the clamp ring during deposition of the electrolyte layer).

D1 denotes the thickness of the lithium cobalt oxide cathode layer (6.7 µm); D2 denotes the thickness of the LiPON electrolyte layer (2.4 µm); and D3 denotes the thickness of the anode layer (0.89 µm).

Figure 6B:
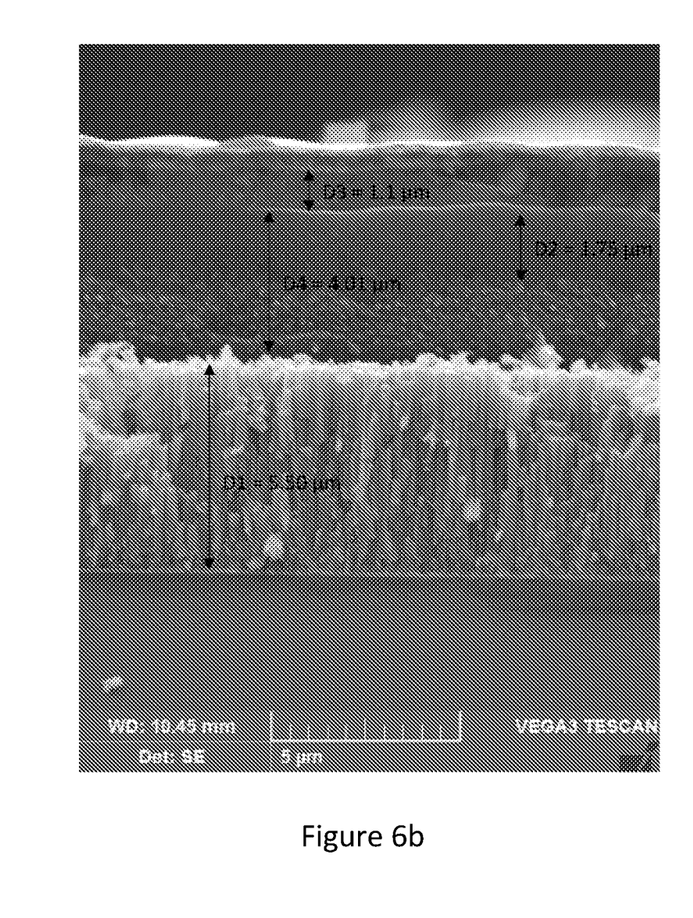

FIG. 6b) shows a scanning electron micrograph of a cross-section of a stack of battery component layers, including a lithium cobalt oxide cathode, a LiPON electrolyte and an anode material, that had been deposited onto a semi-conductive support layer (a silicon wafer). The LiPON electrolyte layer was not deposited according to the method of the invention (that is, the partially-fabricated battery was not insulated from the clamp ring during deposition of the electrolyte layer). Otherwise, the deposition conditions were chosen so as to match those used for the stack shown in FIG. 6a).

D1 denotes the thickness of the cathode layer (5.5 µm) and D3 denotes the thickness of the anode layer (1.1 µm).

It was found that the cathode and the anode layers were separated by an intermediate layer (D4) having a thickness of 4.01 µm. This layer appears to be a composite layer made up of a LiPON layer (D2) adjacent the anode and a reaction layer adjacent the cathode. This reaction layer does not have good ionic conductivity and its presence also increases the separation of the cathode and the anode, with the result that the internal resistance of the battery is increased.

Battery Cycling

Figure 7A:
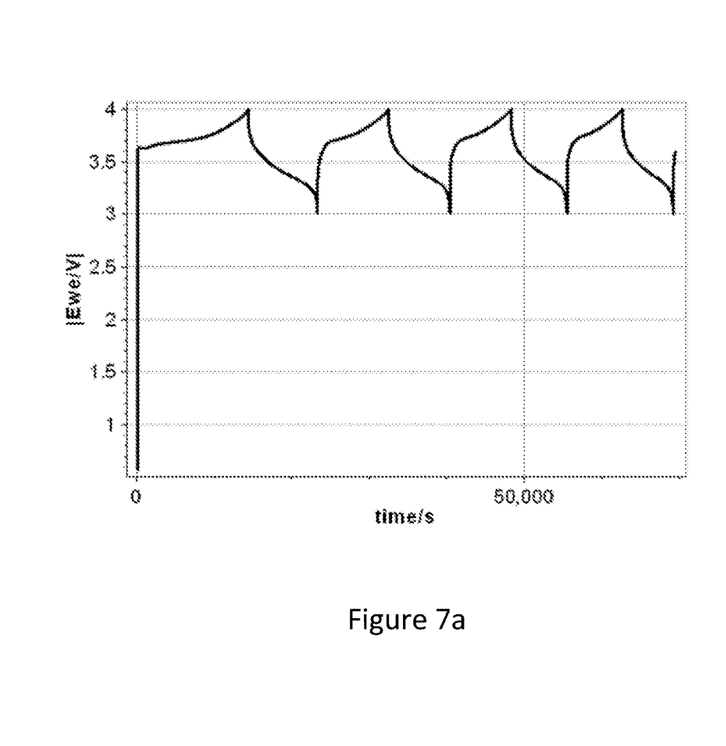
FIGS. 7a) and 7b) are graphs of multiple charge-discharge cycles, shown as a plot of voltage against time, for thin film batteries built up on a semiconductor support layer. The electrolyte of the battery of FIG. 7a) was deposited according to an example of the method of the invention. The electrolyte of the battery of FIG. 7b) was not deposited according to the method of the invention.

FIG. 7a) shows a graph of multiple charge and discharge cycles measured from a thin film battery built up from layers deposited on a semi-conductive support layer (a silicon wafer), in which the LiPON electrolyte was deposited according to an example of the method of the invention. This confirms good performance of the battery.

Figure 7B:
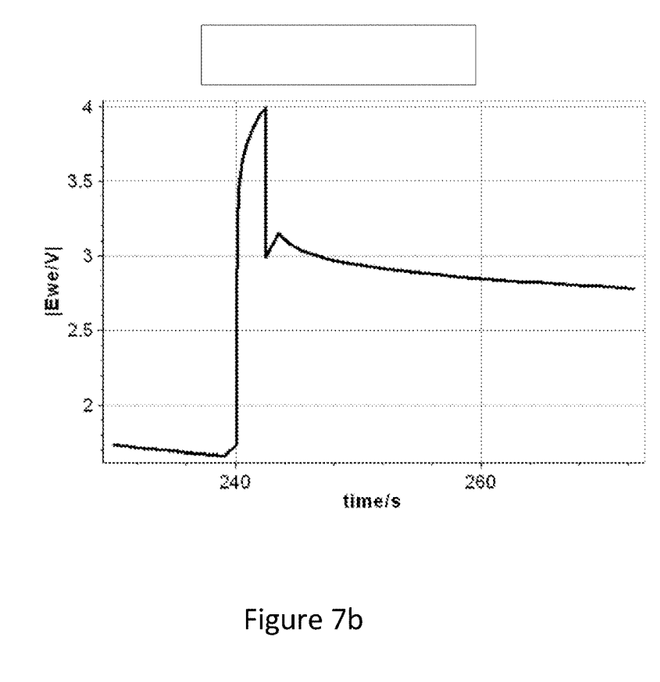

FIG. 7b) shows the results of a similar attempt at battery cycling, carried out on a battery that was built up on a semi-conductive support layer (a silicon wafer), but for which the LiPON electrolyte was not deposited according to the method of the invention, that is, the support layer was not electrically insulated from the clamp ring. From this it may be seen that the battery failed to complete even a single cycle. This is thought to be due to the migration of lithium ions from the lithium cobalt oxide towards the deposited LiPON layer during the deposition process, resulting in a LiPON-reaction layer that increases the internal resistance of the battery. The impact of this increased internal resistance is observed clearly during charging, the battery reaches the cut-off voltage of 4V in only a few seconds and thus the battery was not able to be charged.

Impedance Measurements

Impedance measurements were carried out on batteries prepared by depositing the following layers on a support layer of boron-doped silicon:
Adhesion layer: titanium dioxide;
Cathode current collector layer: platinum;
Cathode layer: lithium cobalt oxide cathode;
Electrolyte layer: LiPON electrolyte;
An anode material;
An anode current collector layer.

The measurements were carried out using an Impedance Analyzer. The impedance was measured using an AC excitation signal with an amplitude of 10 mV across a frequency range of 1 MHz to 0.1 Hz. The response at each frequency was determined using a five second integration time. Seven frequencies were measured per decade with logarithmic spacing between the upper and lower frequency limits.

Figure 8A:
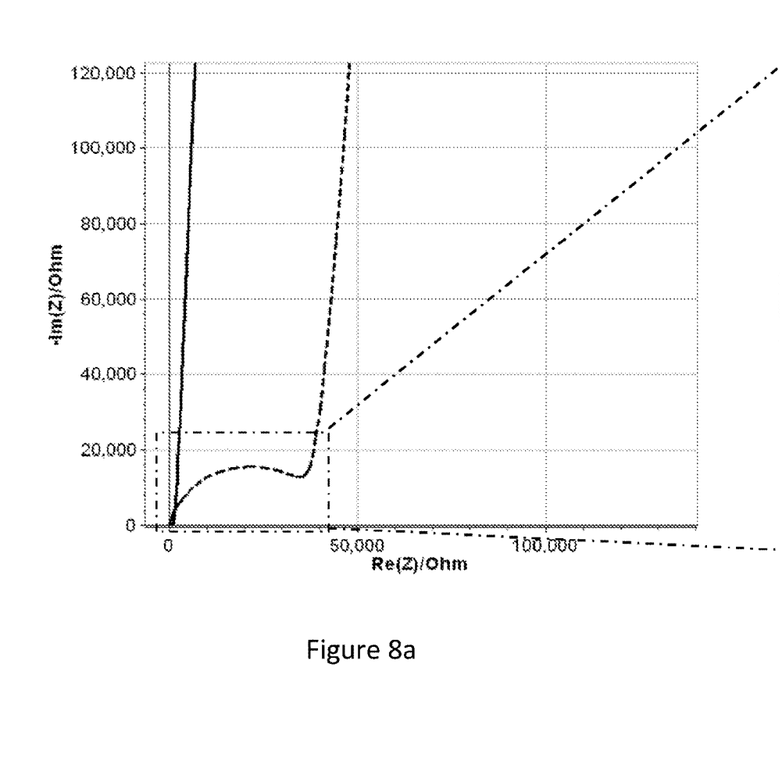
FIGS. 8a) and 8b) are graphs of the electrical AC response used to determine the impedance of thin film batteries.
Figure 8B:
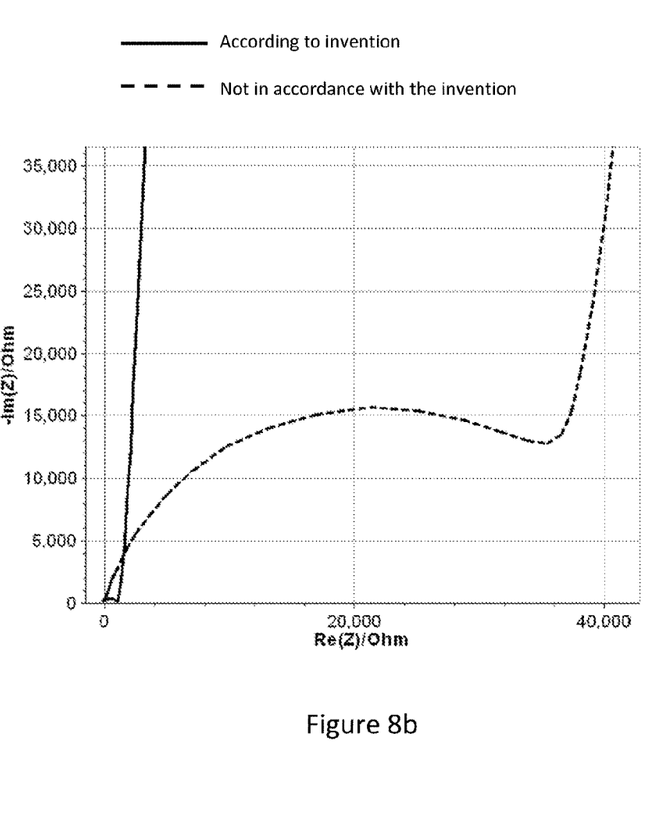

FIG. 8a) shows a Nyquist diagram for a battery in which the electrolyte was deposited according to an example of the method of invention (these results are indicated by the continuous line) and one for a battery not deposited in accordance with the method of the invention (these results are indicated by the dashed line). FIG. 8b) shows an enlarged portion of FIG. 8a).

In these diagrams, -Im(Z) (the imaginary part of the complex impedance) is plotted against Re(Z) (the real part of the complex impedance). As can be seen from FIG. 8b), both curves are made up of an arc-shaped portion adjacent the origin of the graph (middle to high frequencies) and a linear portion at higher values of the x and y axes (lower frequencies). The diameter of this arc-shaped portion of the curve in the middle-to-high frequency range is a function of the impedance of the charge transfer process occurring in the battery.

As may be seen from FIG. 8b), this impedance is about 1000Ω for the battery deposited according to a method of the invention. By contrast, the battery deposited without isolating the support layer from the sample holder has a significantly higher impedance of about 40000Ω, indicating the presence of a source of increased resistance within the battery.

The invention claimed is:

1. A method of fabricating a component material for a battery cell comprising the steps of:
providing a partially-fabricated battery cell, the partially-fabricated battery cell comprising a substrate having a planar deposition surface consisting of a first face of the substrate and a first battery component layer provided on the planar deposition surface, the substrate having a plurality of further surfaces, the planar deposition surface and the plurality of further surfaces defining the body of the substrate therebetween;
wherein:
the first battery component layer contains charge-carrying metal species and has an exposed surface;
one or more electrically conductive or semi-conductive pathways extend through at least a portion of the substrate, each of the one or more pathways connecting the planar deposition surface to one of the plurality of further surfaces;
the partially-fabricated battery cell is held in position within a deposition chamber by a holding structure and each site of connection between one of the one or more pathways and the holding structure is electrically insulating; and
the partially-fabricated battery cell is separated from the holding structure by one or more dielectric spacers;
the method further comprising the step of depositing a second battery component layer on the first battery component layer, wherein the depositing comprises forming a plasma within the deposition chamber.

2. The method according to claim 1, wherein the holding structure is electrically grounded.

3. The method according to claim 1, wherein the holding structure comprises a clamp ring that extends around at least a portion of the perimeter of the substrate.

4. The method according to claim 1, wherein the step of providing a mask within the deposition chamber, the mask comprising at least one aperture and being arranged such that the planar deposition surface faces towards the mask;
wherein the mask is electrically isolated from the partially-fabricated battery cell.

5. The method according to claim 4, wherein the mask is electrically connected to the holding structure.

6. The method according to claim 4, wherein the at least one aperture defines an area that is at least 70% of the planar deposition surface.

7. The method according to claim 4, wherein the mask has an annular configuration.

8. The method according to claim 1, wherein the substrate comprises a second face opposed to the first face and one of the one or more pathways extends between the first face and the second face.

9. The method according to claim 8, wherein the substrate comprises a support layer for providing mechanical support to the partially-fabricated battery cell, the support layer having an electrical resistivity of 1000 Ω·cm or less in a direction away from the planar deposition surface.

10. The method according to claim 8, wherein the support layer has a thickness of at least 100 μm.

11. The method according to claim 9, wherein the support layer comprises a material selected from the group consisting of: silicon, copper, iron-nickel-cobalt alloys, molybdenum, molybdenum-copper alloys, aluminium, and stainless steel.

12. The method according to claim 11, wherein the support layer comprises p-type or n-type silicon.

13. The method according to claim 1, wherein at least a portion of one of the one or more pathways is aligned with the planar deposition surface.

14. The method according to claim 13, wherein the planar deposition surface is provided by a current collector layer comprising a material selected from the group consisting of: Pt, Ni, Mo, Al, Au, W, Ti, stainless steel, nickel alloys, and indium doped tin oxide (ITO) and other electrically conducting metal oxides.

15. The method according to claim 14, wherein the current collector layer has a thickness in the range 0.05 to 1 μm.

16. The method according to claim 1, wherein the charge-carrying metal species of the first battery component layer comprises $Li^+$ ions.

17. The method according to claim 1, wherein the first battery component layer comprises an electrode active material or an electrolyte.

18. The method according to claim 17, wherein the first battery component layer comprises a positive electrode active material.

19. The method according to claim 18, wherein the first battery component layer comprises a positive electrode active material selected from the group comprising: $LiCoPO_4$, $LiNi_{0.5}Mn_{1.5}O_4$, $LiMn_{1-y}Co_yO_2$, $LiMnPO_4$, $LiMn_2O_4$, $LiCoO_2$, $LiNiO_2$, $LiNi_{1-y}Co_yO_2$, $LiNi_{1-y-z}Mn_yCo_zO_2$ (e.g. $LiNi_{1/3}Mn_{1/3}Co_{1/3}O_2$), $LiFePO_4$, $LiNiPO_4$, $Li_2NiPO_4F$, $Li_2CoPO_4F$, $LiMnPO_4F$, $Li_2CoSiO_4$, $Li_2MnSiO_4$, $FeF_3$, $LiMn_{0.8}Fe_{0.1}Ni_{0.1}PO_4$, $Li_{1-x}VOPO_4$, $Li_3V_2(PO_4)_3$ and $Li_2FePO_4F$.

20. The method according to claim 1, wherein the first battery component layer comprises an electrode active material and the second battery component layer comprises an electrolyte.

21. The method according to claim 20, wherein the electrolyte comprises a material selected from the group consisting of: LiPON, $Li_3PO_4$, LIPBON, cation-doped $Li_7La_3Zr_2O_{12}$ (wherein the cation dopants may include tantalum, barium, niobium, yttrium, zinc, and combinations thereof), $Li_{1.5}Al_{0.5}Ge_{1.5}(PO_4)_3$, and $Li_{1.3}Al_{0.3}Ti_{1.7}(PO_4)_3$.

22. The method according to claim 1, the first battery component layer has a thickness in the range 1-40 μm.

23. The method according to claim 1, the second battery layer is deposited to a thickness in the range 0.3-20 μm.

24. The method according to claim 1, wherein the step of depositing the second battery component layer on the first battery component layer comprises forming a radio-frequency plasma.

25. The method according to claim 1, wherein the step of depositing the second battery component layer on the first battery component layer comprises a sputtering process.

* * * * *